United States Patent
Tateyama

(10) Patent No.: US 6,227,786 B1
(45) Date of Patent: *May 8, 2001

(54) SUBSTRATE TREATING APPARATUS

(75) Inventor: Kiyohisa Tateyama, Kumamoto (JP)

(73) Assignee: Tokyo Electron Limited (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/064,783

(22) Filed: Apr. 23, 1998

(30) Foreign Application Priority Data

May 7, 1997 (JP) .................................... 9-131614

(51) Int. Cl.⁷ .................................... B65H 1/00
(52) U.S. Cl. .................... 414/222.01; 165/80.2; 414/935
(58) Field of Search .................... 118/715, 724, 118/725, 728, 729, 500; 156/345; 165/80.1, 80.2; 414/222.01, 749.1, 935

(56) References Cited

U.S. PATENT DOCUMENTS

| | | | |
|---|---|---|---|
| 4,931,135 | * 6/1990 | Horiuchi et al. | 156/345 |
| 5,421,893 | * 6/1995 | Perlov | 118/725 |
| 5,665,167 | * 9/1997 | Deguchi et al. | 118/723 R |
| 5,820,685 | * 10/1998 | Kurihara et al. | 118/729 |
| 5,985,035 | * 11/1999 | Tamura et al. | 118/724 |

FOREIGN PATENT DOCUMENTS 8-313855  11/1996  (JP) .

\* cited by examiner

*Primary Examiner*—Richard Bueker
*Assistant Examiner*—Erin Fieler
(74) *Attorney, Agent, or Firm*—Rader, Fishman & Grauer

(57) ABSTRACT

A substrate treating apparatus for subjecting a substrate to a treatment including a heating or cooling treatment has a plate for heating or cooling the substrate. The plate has a plurality of holes formed therein and is arranged to be positioned under the substrate. A plurality of lifter pins for moving the substrate up and down are inserted in the holes, respectively, formed in the plate, and are incorporated with the plate to be movable up and down. A plurality of springs are arranged to bias the lifter pins downward, respectively. A push-up mechanism is used for pushing up the lifter pins while being in contact with bottom ends of the lifter pins. The push-up mechanism is arranged to be separable from the lifter pins. A driving mechanism is arranged to drive the push-up mechanism.

15 Claims, 4 Drawing Sheets

SUBSTRATE TREATING APPARATUS

BACKGROUND OF THE INVENTION

The present invention relates to a substrate treating apparatus for subjecting a substrate, such as an LCD substrate or semiconductor wafer, to a thermal treatment, such as a heating treatment, cooling treatment, or hydrophobic treatment, in a system for subjecting the substrate to, for example, coating of a resist liquid, and development of a resist film.

In a process of manufacturing, for example, LCDs or semiconductor devices, electric circuits are formed by means of a so-called lithography technique, in which an object to be processed, i.e., a substrate is coated with a photoresist, and then the photoresist is light-exposed in accordance with a circuit pattern and is developed.

Such resist coating and developing steps include heating treatments and cooling treatments thereafter, to perform a pre-baking treatment for stabilizing the resist, a post-exposure-baking treatment after the light-exposure, and a post-baking treatment after the development. These heating treatments and cooling treatments are respectively carried out in heating treatment apparatuses each having a heating plate and cooling treatment apparatuses each having a cooling plate. Further, in a hydrophobic treatment using HMDS, the substrate is heated by a heating plate similar to that used in the heating treatment apparatuses.

As shown in FIG. 1, such a heating, cooling, or hydrophobic treatment apparatus has a plate 101 for heating or cooling a substrate S, a plurality of lifter pins 103 inserted in holes 102 formed in the plate 101, and a support member 104 supporting the lifter pins 103. The support member 104 is moved up and down by an elevating mechanism (not shown) so that the lifter pins 103 are moved up and down by the support member 104, when the substrate S is transferred between a transfer position and a process position.

In the heating treatment apparatus, however, when the temperature of the plate 101 is increased to heat the substrate S, the pitch of the holes 102 is shifted due to thermal expansion of the plate 101. Similarly, in the cooling treatment apparatus, the pitch of the holes 102 is shifted due to thermal contraction of the plate 101.

Conventionally, in order to accommodate the structure to the shift in the pitch of the holes caused due to thermal expansion or contraction of the plate 101, the holes 102 are formed to have a larger diameter to widen a gap around the pin 103 in each hole 102. In other words, the gap around the pin 103 in each hole 102 has a size large enough to allow the pin 103 to be moved up and down without a hitch even when the pitch of the holes 102 are shifted.

However, since the substrate S is not heated or cooled at portions where the holes 102 have such a large diameter, the temperature distribution on the substrate S becomes less uniform.

In order to solve this problem, Jpn. Pat. Appln. KOKAI Publication No. 8-313855 discloses a technique. In this technique, lifter pins 103 are provided with play at portions where the lifter pins 103 are attached to a support member 104, so that the pins 103 can move to follow a shift in a hole pitch. With this arrangement, since the holes do not have to have a larger diameter, the temperature distribution on a substrate S is prevented from becoming less uniform.

However, in this technique, since the lifter pins do not swiftly follow the shift in the hole pitch, the pins are apt to be inclined. Besides, the pins require some rigidity, and thus should not be too thin. Accordingly, the diameter of the holes cannot be so small, thereby bringing about a limit in increasing uniformity in the temperature of the substrate with a high accuracy.

BRIEF SUMMARY OF THE INVENTION

An object of the present invention is to provide a substrate treating apparatus, in which the temperature distribution on a substrate is prevented from becoming uneven when the substrate is heated or cooled by a plate, and lifter members, such as lifter pins, have a high follow-up ability.

According to a first aspect of the present invention, there is provided a substrate treating apparatus for subjecting a substrate to a treatment including a heating or cooling treatment, comprising:

a plate for heating or cooling the substrate, the plate having a plurality of holes formed therein and being arranged to be positioned under the substrate;

a plurality of lifter members for moving the substrate up and down, the lifter members being inserted in the holes, respectively, formed in the plate, and being incorporated with the plate to be movable up and down; and a push-up mechanism for pushing up the lifter members, the push-up mechanism being arranged to be separable from the lifter members.

To summarize, in this arrangement, the lifter members for moving the substrate up and down are inserted in the holes, respectively, formed in the plate, and are incorporated with the plate to be movable up and down, and a push-up mechanism for pushing up the lifter members is arranged to be separable from the lifter members. As a result, the lifter members can be easily moved to follow a shift in the holes caused due to heating or cooling of the plate. It follows that the lifter members require no large gaps around them and can be thin without causing any problem, thereby effectively preventing the temperature distribution on the substrate from becoming uneven. Further, since the lifter members are incorporated with the plate, they have a high follow-up ability.

According to a second aspect of the present invention, there is provided a substrate treating apparatus for subjecting a substrate to a treatment including a heating or cooling treatment, comprising:

a plate for heating or cooling the substrate, the plate having a plurality of holes formed therein and being arranged to be positioned under the substrate;

a plurality of lifter pins for moving the substrate up and down, the lifter pins being inserted in the holes, respectively, formed in the plate, and being incorporated with the plate to be movable up and down;

spring means for biasing the lifter pins downward;

a push-up mechanism for pushing up the lifter pins while being in contact with bottom ends of the lifter pins, the push-up mechanism being arranged to be separable from the lifter pins; and a driving mechanism for driving the push-up mechanism.

To summarize, in this arrangement, the lifter pins for moving the substrate up and down are inserted in the holes, respectively, formed in the plate, and are incorporated with the plate to be movable up and down, and a push-up mechanism for pushing up the lifter pins while being in contact with bottom ends of the lifter pins is arranged to be separable from the lifter pins. As a result, the lifter pins can be easily moved to follow a shift in the holes caused due to heating or cooling of the plate. It follows that the lifter pins require no large gaps around them and can be thin without causing any problem, thereby effectively preventing the temperature distribution on the substrate from becoming uneven. Further, since the lifter pins are incorporated with the plate, they have a high follow-up ability. Furthermore, since the lifter pins are biased downward by the spring means, they can be moved down to follow the push-up member being moved down by the driving mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be explained in detail with reference to the accompanying drawings hereinafter.

Figure 1:
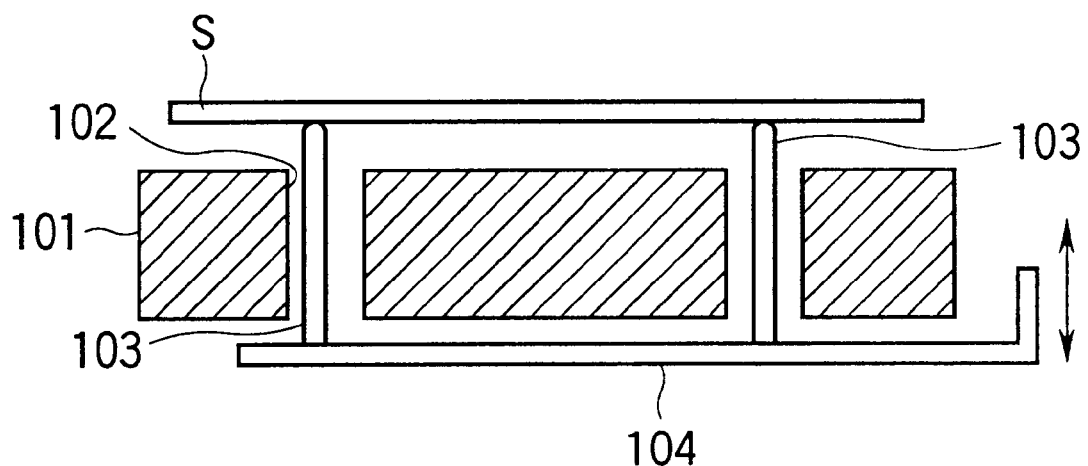
FIG. 1 is a cross-sectional view showing a conventional heating or cooling treatment apparatus.
Figure 2:
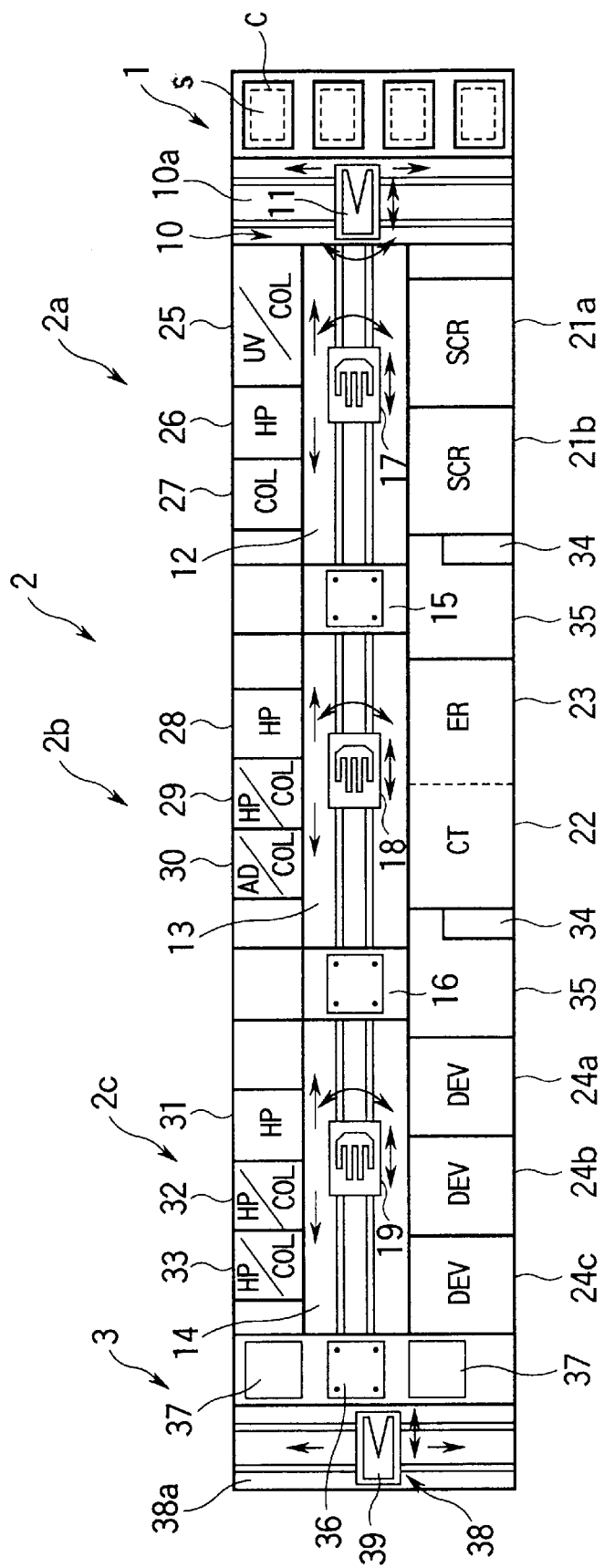
FIG. 2 is a perspective view showing a resist coating and developing system to which a treatment apparatus according to the present invention is applied.

FIG. 2 is a plan view showing an LCD substrate coating/developing process system to which the present invention is applied.

This coating/developing process system comprises a cassette station 1 in which a cassette C to incorporate a plurality of substrates S therein is loaded, a processor portion 2 including a plurality of processing units which apply a series of processes including coating/developing of resist to the substrates S, and an interface portion 3 for transferring the substrate S between the coating/developing process system and an exposure unit (not shown). The cassette station 1 and the interface portion 3 are provided to both ends of the processor portion 2 respectively.

The cassette station 1 comprises a carrying mechanism 10 for carrying an LCD substrate between the cassette C and the processor portion 2. Loading/unloading the cassette C into/from the cassette station 1 is then carried out. In addition, the carrying mechanism 10 comprises carrying arms 11 which are movable on carrying paths 10a provided along an alignment direction of the cassettes, and the substrate S can be carried between the cassette C and the processor portion 2 by virtue of the carrying arms 11.

The processor portion 2 is divided into a front stage portion 2a, an intermediate stage portion 2b, and a rear stage portion 2c, in which carrying paths 12, 13, 14 are provided in their central areas respectively and processing units are arranged on both sides of these carrying paths respectively. Relay portions 15, 16 are provided between the front stage portion 2a, the intermediate stage portion 2b, and the rear stage portion 2c respectively.

The front stage portion 2a comprises a main carrying unit 17 which is movable along the carrying path 12. Two cleaning units (SCR) 21a, 21b are provided to one end side of the carrying path 12, while a ultraviolet irradiating/cooling unit (UV/COL) 25 and a heating treatment unit (HP) 26 and a cooling treatment unit (COL) 27, both being stacked as two upper and lower stages respectively, are provided to the other end side of the carrying path 12.

Then, the intermediate stage portion 2b comprises a main carrying unit 18 which is movable along the carrying path 13. A resist coating process unit (CT) 22 and a peripheral resist removing unit (ER) 23 which can remove the resist on the peripheral portion of the substrate S are provided integrally to one end side of the carrying path 13, whereas heating treatment units (HP) 28 which are stacked as two stages vertically, a heating/cooling treatment unit (HP/COL) 29, in which the heating treatment unit and the cooling treatment unit are stacked vertically, and an adhesion/cooling treatment unit (AD/COL) 30, in which an adhesion treatment unit and a cooling treatment unit are stacked vertically, are provided to the other end side of the carrying path 13.

In addition, the rear stage portion 2c comprises a main carrying unit 19 which is movable along the carrying path 14. Three developing process units 24a, 24b, 24c are provided to one end side of the carrying path 14, while heating process units 26, which are stacked as two stages vertically, and two heating/cooling treatment units (HP/COL) 32, 33, in which a heating process unit and a cooling process unit are vertically stacked respectively, are provided to the other end side of the carrying path 14.

The processor portion 2 is so constructed that spinner system units such as a cleaning process unit 21a, a resist process unit 22a, a developing process unit 24a, etc. are arranged on one side of the carrying path, while only thermal system process units such as the heating treatment unit, the cooling treatment unit, etc. are arranged on the other side of the carrying path.

The main carrying units 17, 18, 19 comprise an X-axis driving mechanism and a Y-axis driving mechanism in two horizontal directions of a horizontal surface and a Z-axis driving mechanism in the vertical direction respectively, and comprises a rotation driving mechanism for driving around the Z-axis.

The main carrying unit 17 has functions of transferring/receiving the substrate S to/from the arms 11 of the carrying mechanism 10, and loading/unloading the substrate S into/from respective process units in the front stage portion 2a, and transferring/receiving the substrate S to/from the relay unit 15. Also, the main carrying unit 18 has functions of transferring/receiving the substrate S to/from the relay unit 15, and loading/unloading the substrate S into/from respective process units in the intermediate stage portion 2b, and transferring/receiving the substrate S to/from the relay unit 16. In addition, the main carrying unit 19 has functions of transferring/receiving the substrate S to/from the relay unit 16, loading/unloading the substrate S into/from respective process units in the rear stage portion 2c, and transferring/receiving the substrate S to/from the interface portion 3. The relay units 15, 16 can also act as a cooling plate respectively.

The interface portion 3 comprises an extension 36 for holding the substrate temporarily when the substrate is transferred/received to/from the processor portion 2, two buffer stages 37 which are provided on both sides of the extension 36 and in which buffer cassettes are arranged, and a carrying mechanism 38 for carrying the substrate S between the extension 36/two buffer stages 37 and an exposure unit (not shown). The carrying mechanism 38 includes a carrying arm 39 which is movable on carrying paths 38a provided along the alignment direction of the extension 36 and the buffer stages 37. The substrate S can be carried between the processor portion 2 and the exposure unit by the carrying arm 39.

Like the above, space saving and improvement in the efficiency of the process can be achieved by incorporating respective process units together.

In the coating/developing process system as constructed above, the substrate S in the cassette C is carried into the processor portion 2. Then, in the processor portion 2, first the substrate S is subjected to surface modifying/cleaning process in the ultra-violet irradiating/cooling unit (UV/COL) 25 and then to scriber cleaning process in the cleaning units (SCR) 21a, 21b after the substrate has been cooled, then is dried by heating operation in the heating treatment unit (HP) 26, and then is cooled in the cooling treatment unit (COL) 27.

After this, the substrate S is carried to the intermediate stage portion 2b and then to hydrophobicity treatment (HMDS treatment) in the upper stage adhesion treatment unit (AD) of the unit 30 in order to enhance a fixing property of the resist. Then, the substrate S is cooled in the cooling unit (COL) and then coated with the resist in the resist coating unit (CT) 22. Then, extra resist on the peripheral portion of the substrate S is removed in the peripheral resist removing unit (ER) 23. Then, the subject S is subjected to prebake process in the heating treatment unit (HP) in the intermediate stage portion 2b and then is cooled in the lower stage cooling treatment unit (COL) in the unit 29 or 30.

Thereafter, the substrate S is carried by the main carrying unit 19 from the relay portion 16 to the exposure unit via the interface portion 3, and then predetermined patterns are exposed on the substrate S. Then, the substrate S is carried again via the interface portion 3 and then is developed in any of the developing process units (DEV) 24a, 24b, 24c to form predetermined patterns thereon. The developed substrate S is subjected to postbake process in any of the heating treatment unit (HP), then is cooled in the cooling treatment unit (COL), and then is put in the predetermined cassette on the cassette station 1 by virtue of the main carrying units 19, 18, 17 and the carrying mechanism 10.

An explanation will be given on the heating treatment units (HP) which exemplify a substrate processing apparatus according to an embodiment of the present invention.

Figure 3:
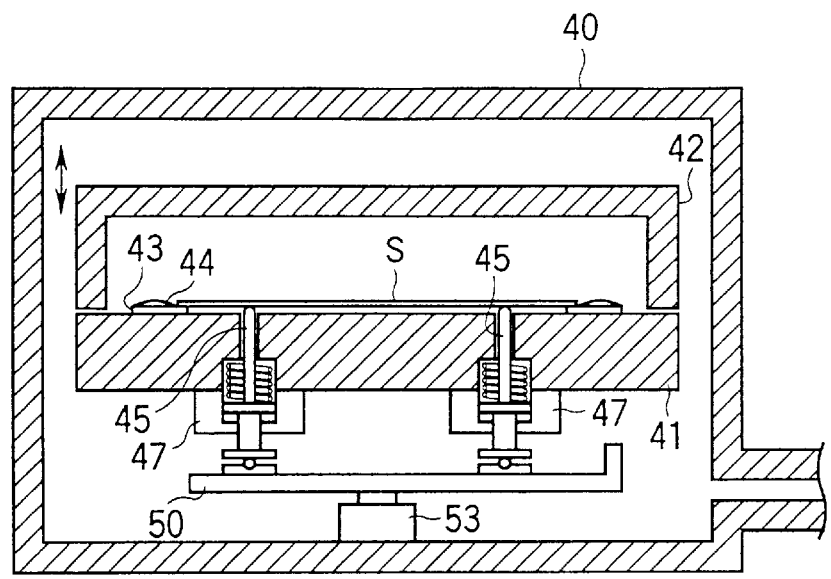
FIG. 3 is a cross-sectional view showing a heating treatment unit according to an embodiment of the present invention.

The heating treatment units (HP) have the same structure, in which a heating plate 41 for heating the substrate S is disposed in a casing 40 such that the heating plate 41 has a horizontal top surface, as shown in FIG. 3. The heating plate 41 is provided with a heater (not shown), so that it can be set at a predetermined temperature.

A plurality of spacers 44 are arranged on the top surface of the heating plate 41, for holding the substrate S. In other words, this structure adopts a proximity type in which the substrate S is not brought into directly contact with the heating plate 41, but is heated with radiation heat from the heating plate 41. With this arrangement, the substrate 41 is prevented from being contaminated by the heating plate 41. Support members 43 are fixed to the spacers 44 by screws, respectively, such that the substrate S is supported by the support members 43.

A cover 42 is arranged above the heating plate 41 to be movable up and down. The cover 42 is used to cover the surface of the heating plate 41 while the substrate S is heated, so that the substrate S is protected from a disturbance given from the outside and a predetermined treating atmosphere is formed therein. When the substrate S is transferred onto or from the heating plate 41, the cover 42 is retreated upward.

Figure 4:
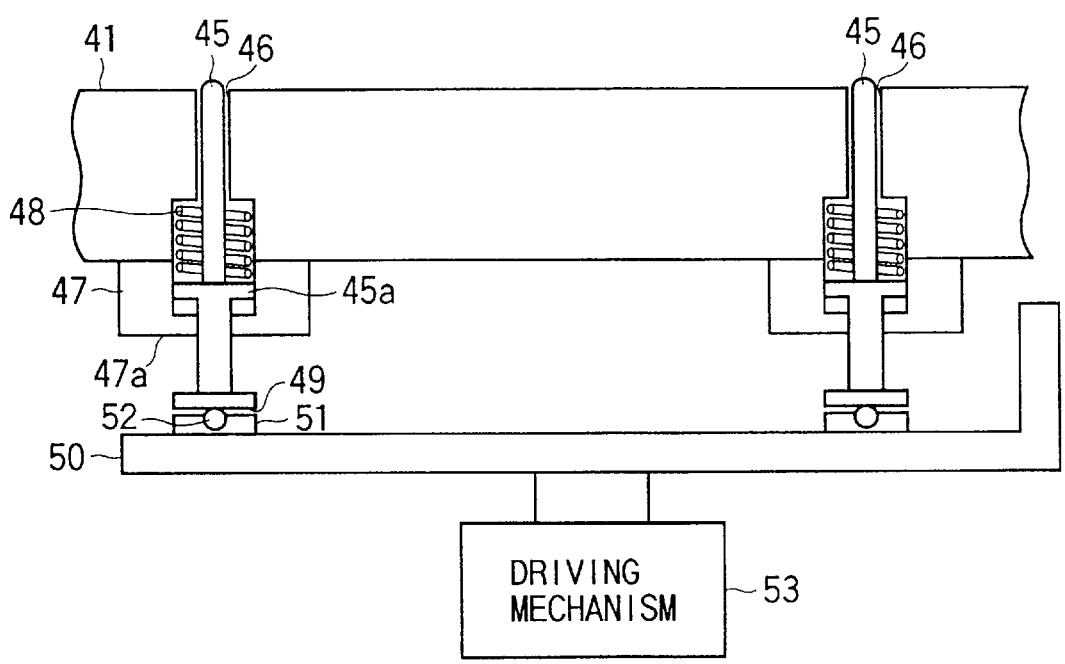
FIG. 4 is a cross-sectional view showing the main part of the heating treatment unit according to the embodiment of the present invention.

As shown in FIG. 4, a plurality of, i.e., more than three, holes 46 are formed in the heating plate 41. A plurality of lifter pins 45, used as lifter members, are arranged in the holes 46, respectively, to be movable up and down. The lifter pins 45 are secured in the heating plate 41 by securing members 47, respectively, mounted on the bottom surface of the heating plate 41, so that the lifter pins 45 are incorporated with the heating plate 41 and do not drop off the plate 41. More specifically, each of the lifter pins 45 has a flange portion 45a, which is secured by a securing portion 47a formed in each of the securing members 47. Each of the lifter pins 45 also has a contact surface 49 having a large surface area at its bottom.

On the other hand, a push-up member 50 is arranged under the lifter pins 45 to be separable from the pins 45 and movable up and down by a driving mechanism 53. At positions corresponding to the lifter pins 45, the push-up member 50 is provided with abutments 51, in which pillow balls 52 are embedded, respectively, to be exposed upward. The contact surfaces 49 of the lifter pins 45 are in contact with the pillow balls 52, respectively.

Springs 48 are arranged around the lifter pins 45, respectively, in the heating plate 41 to bias the lifter pins 45 downward. When the lifter pins 45 are moved up, the push-up member 50 is moved up by the driving mechanism 53 so that the lifter pins 45 are pushed up by the push-up member 50. Whereas the lifter pins 45 are moved down, the push-up member 50 is moved down, so that the lifter pins 45 are moved down by the bias force of the springs 48.

In the heating treatment unit (HP) having the above described structure, the lifter pins 45 are moved up by moving up the push-up member 50 by the driving mechanism 53 while the cover 42 is kept at its upper state. In this state, the lifter pins 45 receive the substrate S. Then, the push-up member 50 is moved down, and thus the lifter pins 45 are moved down by the bias force of the springs 48. With this operation, the substrate S is mounted on the support members 43 of the heating plate 41. Then, the cover 42 is moved down. In this state, the substrate S is subjected to a heating treatment by the heating plate.

In this case, the pitch of the holes 46 is shifted due to thermal expansion of the heating plate 41. However, the lifter pins 45 can be easily moved to follow the shift in the holes 46, because the lifter pins 45 are incorporated with the heating plate 41 by the securing members 47 such that they are movable through the holes 46, and the push-up member 50 is arranged to be separable from the lifter pins 45. Further, this movement is allowed to be smoothly performed by the pillow balls 52 interposed between the contact surfaces 49 of the lifter pins 45 and the abutments 51 of the push-up member 50. Accordingly, lifter pins 45 do not require large gaps around them and can have a very small diameter of, for example, about from 1 mm to 2 mm. As a result, it is possible to solve such problems that the substrate S have a temperature distribution copying a trace of the holes 46 for the lifter pins 45, thereby effectively preventing the temperature distribution on the substrate S from becoming uneven. Since the lifter pins 45 are incorporated with the heating plate 41, they have a high follow-up ability. Besides, since the lifter pins 45 are biased downward by the springs 48, they can be moved down to follow the push-up member 50 being moved down by the driving mechanism 53.

Although the heating treatment units (HP) have been explained, the cooling treatment units (COL) also have a structure similar to that of the heating treatment units (HP), except that a cooling plate for cooing a substrate is used in place of the heating plate. Where the present invention is applied to the cooling treatment units (COL), lifter pins can be moved to follow holes for them when the pitch of the holes is shifted due to thermal contraction of a cooled plate. Namely, the present invention can provide the cooling treatment units (COL) with the same effect as in the heating treatment units (HP). Further, the adhesion treatment unit (AD) also has a heating mechanism similar to that of the heating treatment units (HP), so that a substrate can be subjected to a treatment with HMDS gas while it is heated. Namely, the present invention can provide the adhesion treatment unit (AD) with the same effect as in the heating treatment units (HP).

Figure 5:
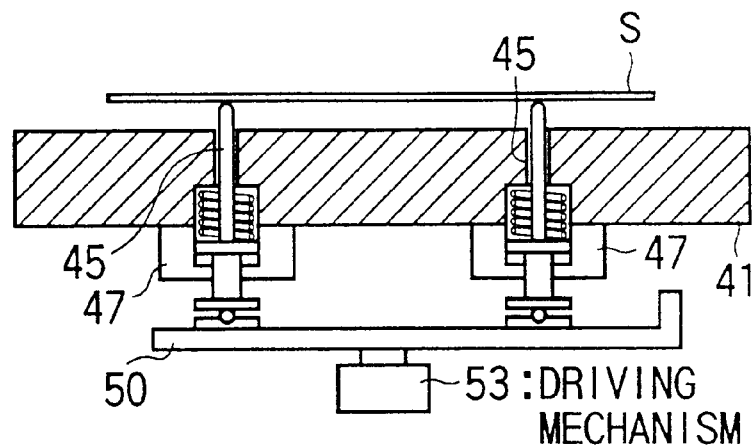
FIG. 5 is a cross-sectional view showing a heating treatment unit according to another embodiment of the present invention.
Figure 6:
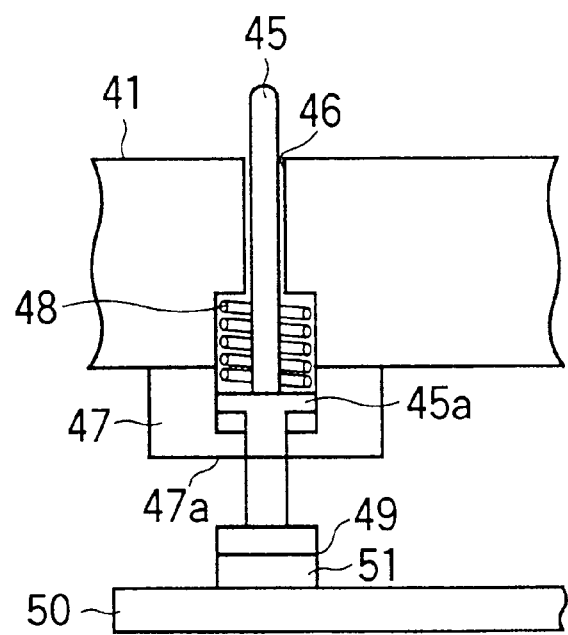
FIG. 6 is a cross-sectional view showing the main part of a heating treatment unit according to still another embodiment of the present invention.

The present invention is not limited to the above described embodiment, but may be modified in various manners. For example, as shown in FIG. 5, it is possible to adopt a so-called pin-proximity type in which a substrate S is held by the lifter pins 45 rather than the support members 43 such that the substrate S is separated from the heating plate 41 by a predetermined distance. In this case, the lifter pins 45 are projected from the surface of the plate 41 when the lifter pins 45 are positioned in undermost positions.

In the above described embodiment, the pillow balls 52 are interposed between the contact surfaces 49 of the lifter pins 45 and the abutments 51 of the push-up member 50. Instead, the contact surfaces 49 of the lifter pins 45 and the abutments 51 may be made of a slippery material, such as Teflon or slippery engineering plastic (e.g., ultrahigh polymer polyethylene), so that the contact surfaces 49 of the lifter pins 45 can be in direct-contact with the top surface of the abutments 51.

Furthermore, the present invention is not limited to the above described embodiment which is exemplified by an apparatus in a resist coating and developing system, but may be applied to other treatments. An object to be treated in the present invention is not limited to an LDC substrate, but may be another object to be treated, such s a semiconductor wafer.

Besides, the present invention can be applied to a case, such as the above described adhesion treatment, where a heating or cooling treatment is performed in company with a gas treatment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate treating apparatus, used in a baking step included in a photolithography process, comprising:
    a plate for heating or cooling a substrate, said plate having a plurality of holes formed therein and being arranged to be positioned under said substrate;
    a plurality of moveable pins for moving said substrate up and down, each movable pin being attached to said plate and horizontally movable along with said plate, said movable pins being inserted in said holes, respectively, formed in said plate, and being incorporated with said plate to be vertically movable up and down without contacting with said plate, even when said movable pins are moved up or down to any movable position; and
    a push-up mechanism for pushing up said movable pins, said push-up mechanism being arranged to be detachably in contact with said movable moveable pins below said plate.

2. The apparatus according to claim 1, wherein said plate comprises securing members for securing said movable pins to be incorporated with said plate.

3. The apparatus according to claim 1, further comprising urging means for urging said movable pins downward.

4. The apparatus according to claim 1, wherein said apparatus is arranged to perform said heating or cooling treatment while performing another treatment.

5. The apparatus according to claim 4, wherein said another treatment is a gas treatment.

6. The apparatus according to claim 1, wherein said movable pins are projected from a surface of said plate when said movable pins are positioned in their lowermost positions.

7. A substrate treating apparatus, used in a baking step included in a photolithography process, comprising:
    a plate for heating or cooling a substrate, said plate having plurality of holes formed therein and being arranged to be positioned under said substrate;
    a plurality of movable pins for moving said substrate up and down, each movable pin being attached to said plate and horizontally movable along with said plate, said movable pins being inserted in said holes, respectively, formed in said plate, and being incorporated with said plate to be to be vertically movable up and down without contacting with said plate, even when said movable pins are moved up or down to any position;
    springs for urging said movable pins downward, respectively;
    support section for supporting said moveable pins, said support section being arranged to be detachably in contact with said moveable pins below said plate; and
    a driving mechanism for pushing up said support section.

8. The apparatus according to claim 7, wherein said movable pins comprise flange portions, respectively, and said plate comprises securing members for securing said flange portions of said movable pins, respectively.

9. The apparatus according to claim 7, wherein balls are interposed between said support section and said movable pins, respectively.

10. The apparatus according to claim 7, wherein contacting portions, through which said support section and bottom ends of said movable pins are in contact with each other, are substantially flat.

11. The apparatus according to claim 7, wherein said apparatus is arranged to perform said heating or cooling treatment while performing another treatment.

12. The apparatus according to claim 11, wherein said another treatment is a gas treatment.

13. The apparatus according to claim 7, wherein said movable pins project from a surface of said plate when said movable pins are positioned in lowermost positions.

14. A substrate treating apparatus, comprising:
- a plate arranged below a substrate, having a plurality of through holes, and serving to heat or cool said substrate so as to bake said substrate;
- a spacer mounted on said plate and partially brought into contact with a peripheral portion only of the substrate to have a gap formed between said plate and the substrate, thereby supporting the substrate;
- a plurality of movable pins inserted into said through holes and formed integral with the plate for vertically moving the substrate, each movable pin being attached to said plate and horizontally movable along with said plate, said movable pins being vertically moveable without contacting with said plate, even when said movable pins are moved up or down to any position; and
- a push-up mechanism for pushing up said movable pins, said push-up mechanism being arranged to be detachably in contact with said movable pins below said plate.

15. A substrate treating apparatus, comprising:
- a plate arranged below a substrate, having a plurality of through holes, and serving to heat or cool said substrate so as to bake said substrate;
- a spacer mounted on said plate and partially brought into contact with a peripheral portion only of the substrate to have a gap formed between said plate and the substrate, thereby supporting the substrate;
- a plurality of movable pins inserted into said through holes and formed integral with the plate for vertically moving the substrate, each movable pin being attached to said plate and horizontally movable along with said plate, said movable pins being vertically movable without contacting with said plate, even when said movable pins are moved up or down to any position; and
- springs urging said movable pins downward, respectively;
- a support section detachably brought into contact with said movable pins for supporting the movable pins below said plate; and
- a driving mechanism for pushing up said support section.

* * * * *